United States Patent [19]
Wild et al.

[11] Patent Number: 5,954,882
[45] Date of Patent: Sep. 21, 1999

[54] PLASMA REACTOR

[75] Inventors: Christof Wild, Denzlingen; Michael Funer, Friesenheim; Peter Koidl, Denzlingen, all of Germany

[73] Assignee: Fraunhofer-Gesellschaft zur Forderung der angewandten Forschung e.V., Munich, Germany

[21] Appl. No.: 08/817,343
[22] PCT Filed: Dec. 8, 1995
[86] PCT No.: PCT/DE95/01786
 § 371 Date: Mar. 28, 1997
 § 102(e) Date: Mar. 28, 1997
[87] PCT Pub. No.: WO96/23318
 PCT Pub. Date: Aug. 1, 1996

[30] Foreign Application Priority Data
Jan. 25, 1995 [DE] Germany ............... 19507077

[51] Int. Cl.$^6$ .................................................. C23C 16/00
[52] U.S. Cl. ................ 118/723 MW; 118/723 ME; 156/345; 204/298.38; 315/111.21
[58] Field of Search ..................... 118/723 MW, 118/723 ME, 723 MR; 156/345; 204/298.38; 315/111.21

[56] References Cited

U.S. PATENT DOCUMENTS

| | | | |
|---|---|---|---|
| 4,563,240 | 1/1986 | Shibata et al. | 156/643 |
| 4,585,668 | 4/1986 | Asmussen et al. | 427/38 |
| 4,866,346 | 9/1989 | Gaudreau et al. | 315/111 |
| 5,433,789 | 7/1995 | Kakehi et al. | 118/723 MW |
| 5,646,489 | 7/1997 | Kakehi et al. | 315/111.21 |

FOREIGN PATENT DOCUMENTS

| | | |
|---|---|---|
| 0 438 179 A1 | 7/1991 | European Pat. Off. . |
| 4307946 A1 | 9/1993 | Germany . |

OTHER PUBLICATIONS

Diamond Deposition Technologies Article, by P.K. Bachmann and W. van Enckevort (1992).

Primary Examiner—R. Bruce Breneman
Assistant Examiner—Luz Alejandro
Attorney, Agent, or Firm—Baker & Daniels

[57] ABSTRACT

A plasma reactor for generating and maintaining plasma. The plasma reactor has a resonant cavity whose cross-section tapers in summit regions in which the wall of the resonant cavity is closed to such an extent that an excited field mode in the region of the cross-sectional tapered portions displays main peaks whose maximum field intensity is increased relative to the field intensity of adjacent secondary peaks. A reaction unit is provided in the region of a main peak with a substrate which is to be processed and which can be coated in the gas phase of the plasma. As a result of the field intensity distribution brought about by a resonant cavity of the given shape, with main peaks which are greatly increased with respect to secondary peaks, process parameters such as gas pressure and coupled electromagnetic power can be selected very largely independently of one another when the plasma is in a stable situation, without the plasma igniting undesirably in the region of the secondary peaks. Furthermore, the comparatively homogeneous field intensity distribution in the main peak maintaining the plasma causes the substrate to be processed uniformly.

14 Claims, 7 Drawing Sheets

PLASMA REACTOR

BACKGROUND OF THE INVENTION

The invention relates to a plasma reactor for generating and maintaining a plasma, specifically for deposition of diamond, comprising a frequency generator and a resonant cavity to which electromagnetic waves are fed by the frequency generator, with a reaction unit being suited for introduction in the resonant cavity bounded by a wall, in a region of high field strength.

Such a plasma reactor is known from the publication "Diamond Deposition Technologies" by P. K. Bachmann and W. van Enckevort, published in the magazine *Diamond and Related Materials,* volume 1, pages 1021 through 1034, in 1992. In this plasma reactor, microwaves generated by means of a frequency generator are via a pin type coupler introduced in a resonant cavity which is fashioned as a resonant cylinder formed by a cylindrical pipe closed endwise. On the sealed end of the resonant cylinder, opposite the pin type coupler, there is a reaction unit arranged with a substrate to be coated from a gas phase formed by an ignited plasma.

In the prior plasma reactor, the situation and shape of the plasma depends very sensitively on process parameters such as gas pressure and coupled microwave power. Moreover, these two process parameters are not selectable independently of one another, but are adjustable in mutual dependence only within a relatively narrow correlation range. Leaving the correlation range occasions frequently an abrupt spatial displacement of the plasma, which, besides disturbing the deposition process, destroys within a short time, e.g., a quartz glass enclosing the substrate and bounding the reaction volume.

A further disadvantage of the prior plasma reactor is its great dependence of the plasma situation on the geometric constraints and the arrangement of the reaction unit.

The objective underlying the invention is to create a plasma reactor which, with a mutually very extensively independent selection of process parameters such as gas pressure and coupled electromagnet power, is characterized by a spatially stable plasma that is homogeneously distributed over the deposition area of a substrate.

SUMMARY OF THE INVENTION

This object is achieved in that the resonant cavity features a wall giving the resonant cavity a cross section tapering in summit regions, the taper of the resonant cavity cross section in the summit regions being such that the field strength distribution established by the wall features at least two main peaks whose maximum field strength is elevated as compared to the field strengths of adjacent secondary peaks.

Fashioning the resonant cavity ellipsoidal, for example, generates a field mode as overlay of eigenmodes with at least two main peaks which in their field strength are distinctly elevated above the field strengths of adjacent secondary peaks. The spatial distribution of these field modes is extensively independent of the electromagnetic power of a burning plasma coupled in the resonant cavity, and specifically also of slight deformations in the resonant cavity wall. With an arrangement of the reaction unit in the region of one of the main peaks a plasma can now be generated that is spatially stable and at variations of process parameters such as gas pressure and/or coupled electromagnetic power most extensively uninfluenced in its situation and which burns homogeneously over a relatively large region, which plasma allows producing hard material layers, specifically diamond layers, in the thin-film technology, performing plasma polymerization and powder synthesis processes in the materials synthesis and nitrating and etching treatments in the plasma surface treatment.

In preferred embodiments, the resonant cavity is fashioned as ellipsoid, as a segmented ellipsoid formed sectionally of ring-shaped conic wall segments or as an asymmetric ellipsoid expanded in diameter in the region of a main peak. In another embodiment, the tapering regions are provided as rotationally symmetric paraboloid sections joined together via a cylindrical section. Common to these embodiments of the resonant cavity is that, with electromagnetic power coupled in the region of a main peak, a stable-burning plasma can be ignited and maintained in the region of the second main peak.

In a further embodiment, the resonant cavity is formed by two ellipsoid sections joined together in the direction of their longitudinal axes, with the reaction unit being arranged so as to enclose a very intensive central peak forming in the region where the ellipsoid sections are joined. In this double-ellipsoid resonator, the electromagnetic power is coupled in at the summit sections of the ellipsoid section opposite the reaction unit.

BREIF DESCRIPTION OF THE DRAWINGS

Further suitable embodiments and advantages of the invention are the object of the subclaims and the following figures description, the figures showing in:

FIG. 6, a partial view of a plasma reactor with a resonant cavity formed of two tapering paraboloid sections and a cylindrical section fitted in between.

DESCRIPTION OF THE PREFERRED EMBODIMENT

Figure 1:
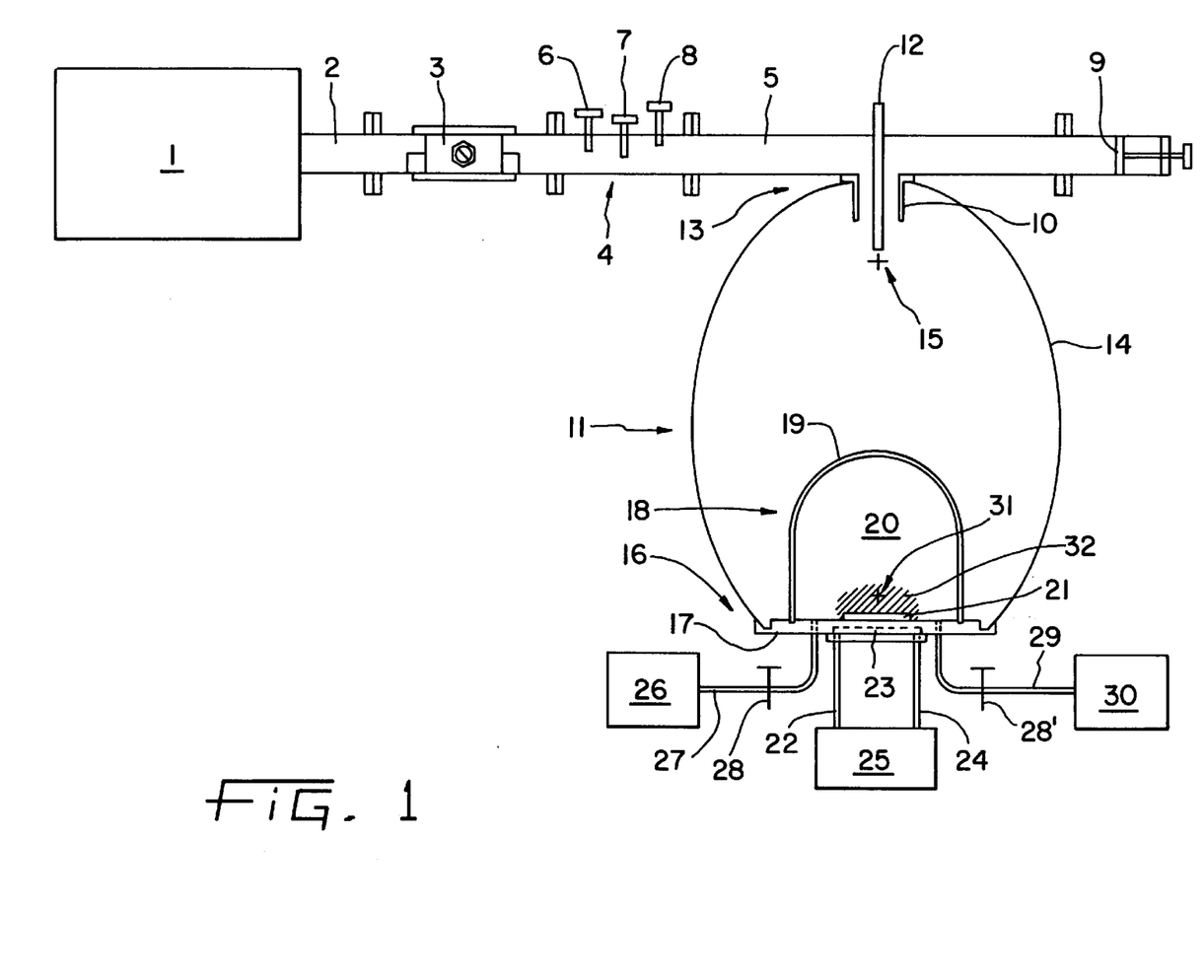
FIG. 1, a plasma reactor with a reaction unit introduced in an ellipsoid resonator.

FIG. 1 shows a plasma reactor for generating and maintaining a plasma, specifically for diamond deposition, comprising a microwave transmitter 1 as frequency generator adapted for coupling an electromagnetic wave in a transverse electric (TE) mode in an output waveguide 2. The frequency of the magnetic wave is in the microwave range, amounting, e.g., to 2.45 gigahertz. In a modification, the frequency amounts to about 915 megahertz.

The electromagnetic wave passing through the output waveguide 2 is introduced in a circulator 3 that is suited to suppress reflected shares feedback to the microwave transmitter 1. Upon passage of the circulator 3 the electromagnetic wave passes through an impedance transformer 4 equipped with tuning pins 6, 7, 8 for insertion in a coupling waveguide 5. The coupling waveguide 5 is a rectangular waveguide which in the direction of propagation of the electromagnetic wave is sealed by a short-circuit slide 9. The piston of the short-circuit slide 9 is movable in the longitudinal direction of the coupling waveguide 5.

The coupling waveguide 5 features in a section in a sidewall a cylindrical coupler 10 protruding in a resonant cavity fashioned as ellipsoid resonator 11. The ellipsoid resonator 11 encloses the volume of an oblong ellipsoid with two short semiaxes of equal length and is made of an electrically conducting material, such as an aluminum alloy or brass alloy adapted for waveguide fabrication. Traversing the coupling waveguide 5, a coupling pin 12 is arranged centrically in the coupler 10, extending along the longitudinal axis of the ellipsoid resonator 11. The coupling pin 12 is movable in longitudinal direction for tuning purposes. The piston of the short-circuit slide 9 is in a position in which the electromagnetic wave has a bulge in the region of the coupling pin 12.

Tapering in the direction of the coupler 10, the summit region 13 of the wall 14 of the ellipsoid resonator 11, bulging out relative to the longitudinal axis, is flush with the section of the coupler 10 resting on the coupling waveguide 5, so that the cylindrical section of the coupler 10 protruding in the ellipsoid resonator 11 forms with the coupling pin 12 a coaxial waveguide, the end of the coupling pin 12 protruding in the ellipsoid resonator 11 being arranged in the region of a couplingside main peak 15 of a field mode of the resonant cavity.

The tapering summit region 16 of the ellipsoid resonator 11, opposite the coupler 10, is fitted on a capping plate 17 of a reaction unit 18. Fastened to the capping plate 17 as closure is a quartz bell 19 that protrudes in the interior of the ellipsoid resonator 11, enclosing together with the capping plate 17 a reaction volume 20. Within the reaction volume 20, a substrate 21 is placed on the capping plate 17 and is coolable by means of a fluid passing through cooling lines 22, 23, 24 from a fluid bath 25.

Dosed by means of a first throttle valve 28, a reaction gas can be introduced in the reaction volume 20 via a gas line 27 connected to a reservoir 26. The gas is a carbonaceous gas for deposition, for example of diamond, such as $CH_4$ or $CO$. Moreover, the reaction volume 20 can be evacuated by means of a vacuum pump 30 communicating via a gas outlet line 29 with the reaction volume 20, the rate of pumping being adjustable by means of a second throttle valve 28' fitted in the gas outlet line 29.

In the operation of the plasma reactor, a field mode formed of overlaid eigenmodes builds up in the resonant cavity as field strength distribution, which in the case of the ellipsoid resonator 11 has two regions of elevated field strength which substantially are disposed around the couplingside main peak 15 and around a reactionside main peak 31 contained within the reaction volume 20. With a coupled microwave power of typically several kilowatts and gas pressures of several ten millibars, a plasma 32 ignites in the region of the main peak 31 contained within the reaction volume 20 and surrounding the substrate 21. In the case of carbonaceous reaction gas, diamond now grows onto the substrate 21 in contingence on the process parameters gas pressure and coupled microwave power, the gas pressure and the microwave power being adjustable extensively independently of one another over a range of typically 20 to 300 millibars and between 0.5 kilowatts to 60 kilowatts, respectively, so that very different structures are producible in their morphology. Specifically when employing a low frequency of the electromagnetic waves, for example the aforementioned 915 megahertz, a large-area homogenous plasma is generated across the surface of substrate 21, due to the stable situation of the reactionside main peak 31.

Figure 2:
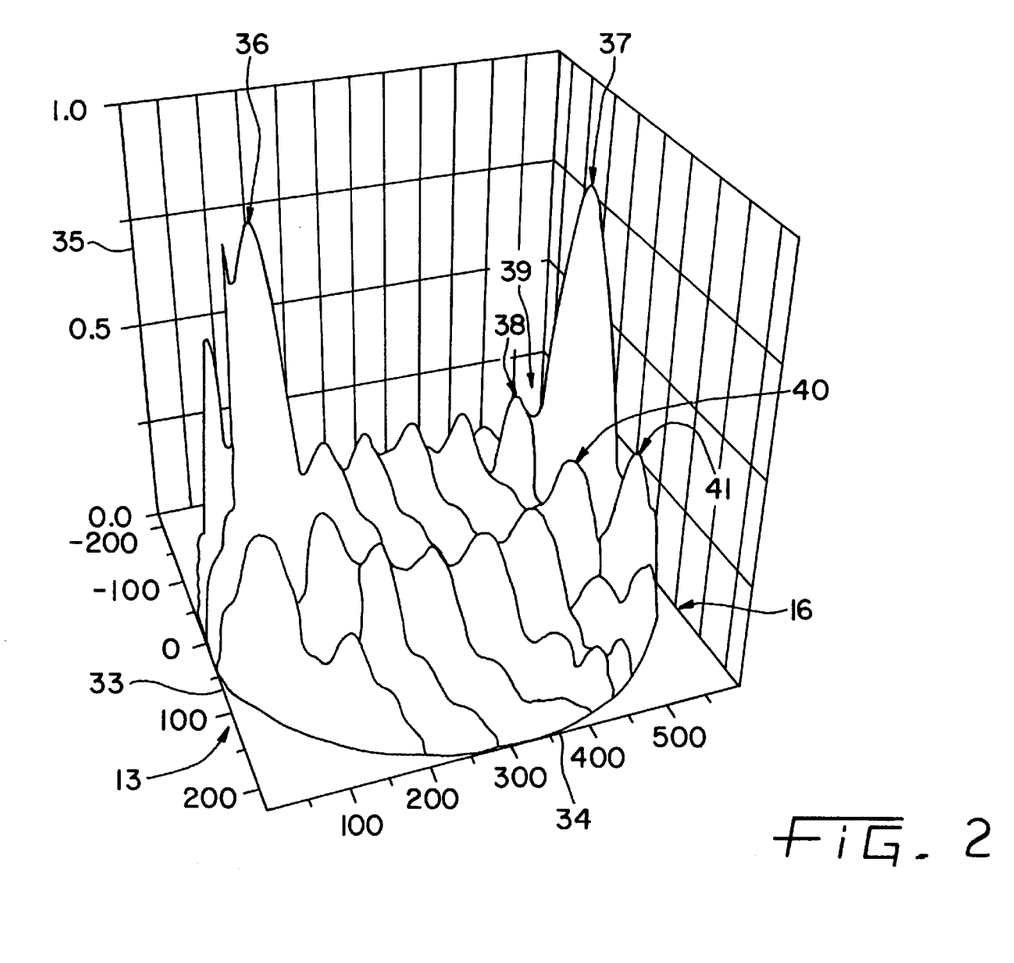
FIG. 2, in three-dimensional presentation, a typical field strength distribution in an ellipsoid resonator.

FIG. 2 shows in a three-dimensional presentation the quantitative electric field distribution, in a center plane, of an ellipsoid resonator 11 configured for operating with a frequency of 2.45 gigahertz. Plotted on the transverse axis 33, symmetric with the value 0, is the radial situation in millimeters. On the longitudinal axis 34, the axial situation 34 is plotted in millimeters, originating in the couplingside summit region 13 of the ellipsoid resonator 11. The quantitative field strength is illustrated on the vertical axis 35 in arbitrary units. Its field distribution shown in FIG. 2, the ellipsoid resonator 11 measures about 60 centimeters in length and about 45 centimeters crosswise.

From the illustration according to FIG. 2 it is evident that an electric cavity field mode with a pronounced first couplingside main peak region 36 and an intensive second main peak region 37 opposite the main peak region 36 on the longitudinal axis forms in the ellipsoid resonator 11, the main peak regions 36, 37 possessing a peak field strength topping adjacent secondary peaks 38, 39, 40, 41 approximately by a factor of 3. This guarantees that the secondary peaks 38, 39, 40, 41, contained in the reaction volume 20 as well, will with process parameters adapted to the second main peak region 37 not lead to plasma ignition at undesirable spots.

Owing to the distinct elevation of the field strength of the second main peak region 37 beyond the secondary peaks 38, 39, 40, 41, as well as to the high spatial stability of the field mode upon modification of the coupled electromagnetic power, the process parameters gas pressure and microwave power are additionally adjustable over a broad range, independently of one another, without occasioning an ignition of a plasma discharge in the region of the secondary peaks 38, 39, 40, 41. Achieved thereby, for one, is a great freedom in the process parameter selection as compared to the conventional resonant cavities while, for another, the plasma remains at the plasma peak 37 situation stable in its situation also upon variation of the coupled electromagnetic power, without encountering a mode jumping. Furthermore, the plasma 32 situation is relatively insensitive also to geometric modifications such as occurring with the introduction of differently configured reaction units 18.

Figure 3:
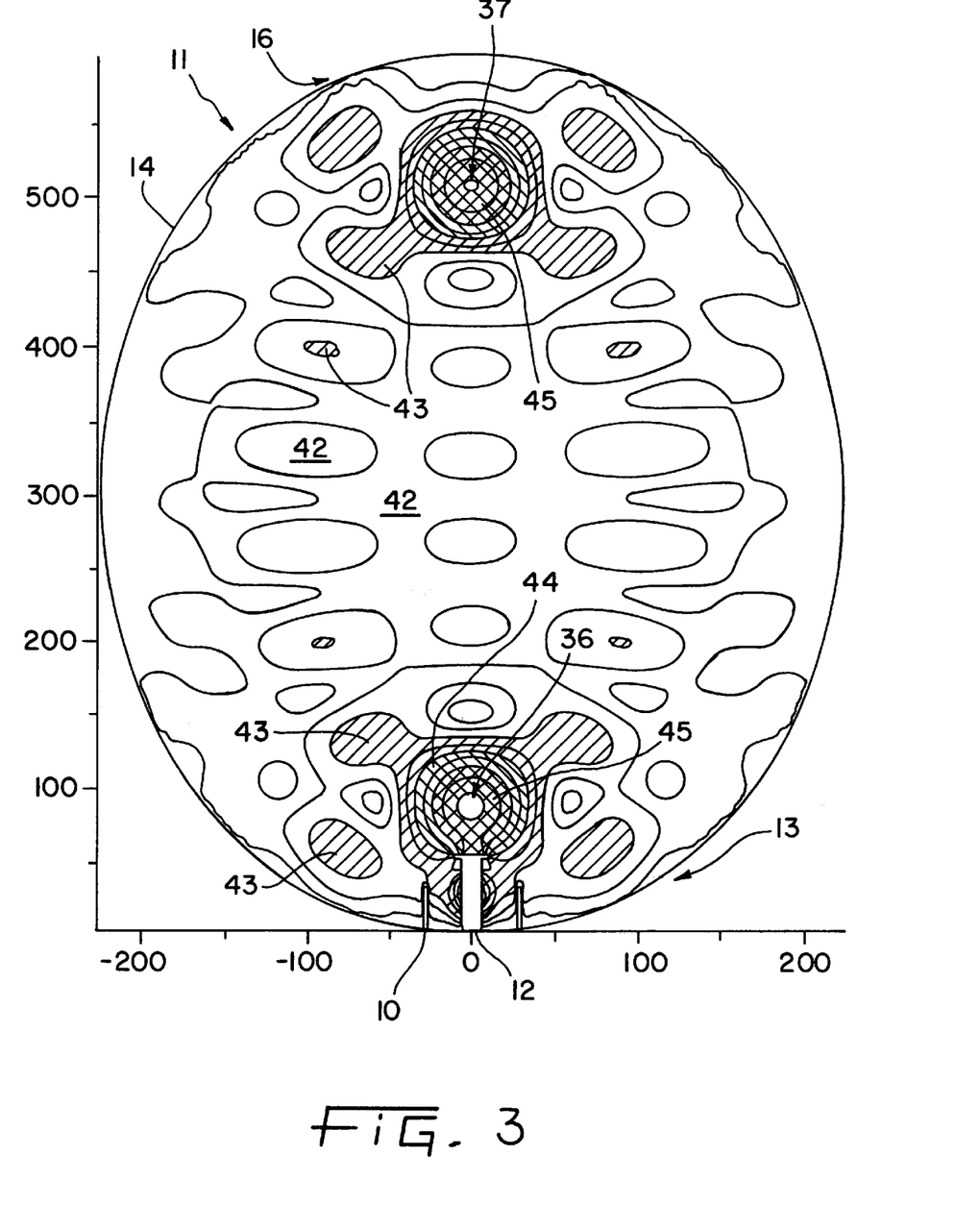
FIG. 3, in contour-line presentation of the field strength distribution of FIG. 2 in an ellipsoid resonator.

FIG. 3 shows the electric field strength distribution of FIG. 2 of the field mode of an ellipsoid resonator 11 in a two-dimensional contour line presentation. Regions 42 without hatching possess in arbitrary units a field strength of 0 to 299, while regions 43 hatched ascending from right to left in the presentation according to FIG. 3 have a field strength of 300 to 499, regions 44 hatched descending from left to right have a field strength of 500 to 699, while cross-hatched regions 45 have a field strength of 700 to 899 and the solid-black tip of the first main peak region 36 as well as the tip of the second main peak region 37, solid-black as well, have a field strength of 900 to 1000.

Obtained by simulation calculations, the presentations of the field strength distribution according to FIG. 2 and FIG. 3 allow for the arrangement of the coupler 10 as well as the coupling pin 12, but not for the effect of the capping plate 17 with the applied substrate 21. The experiment as well as further simulation calculations confirmed the presence of a second main peak region 37 which distinctly towers over the secondary peaks, also with a modification in the summit region 16, opposite the coupler 10, of the ellipsoid resonator 11.

Figure 4:
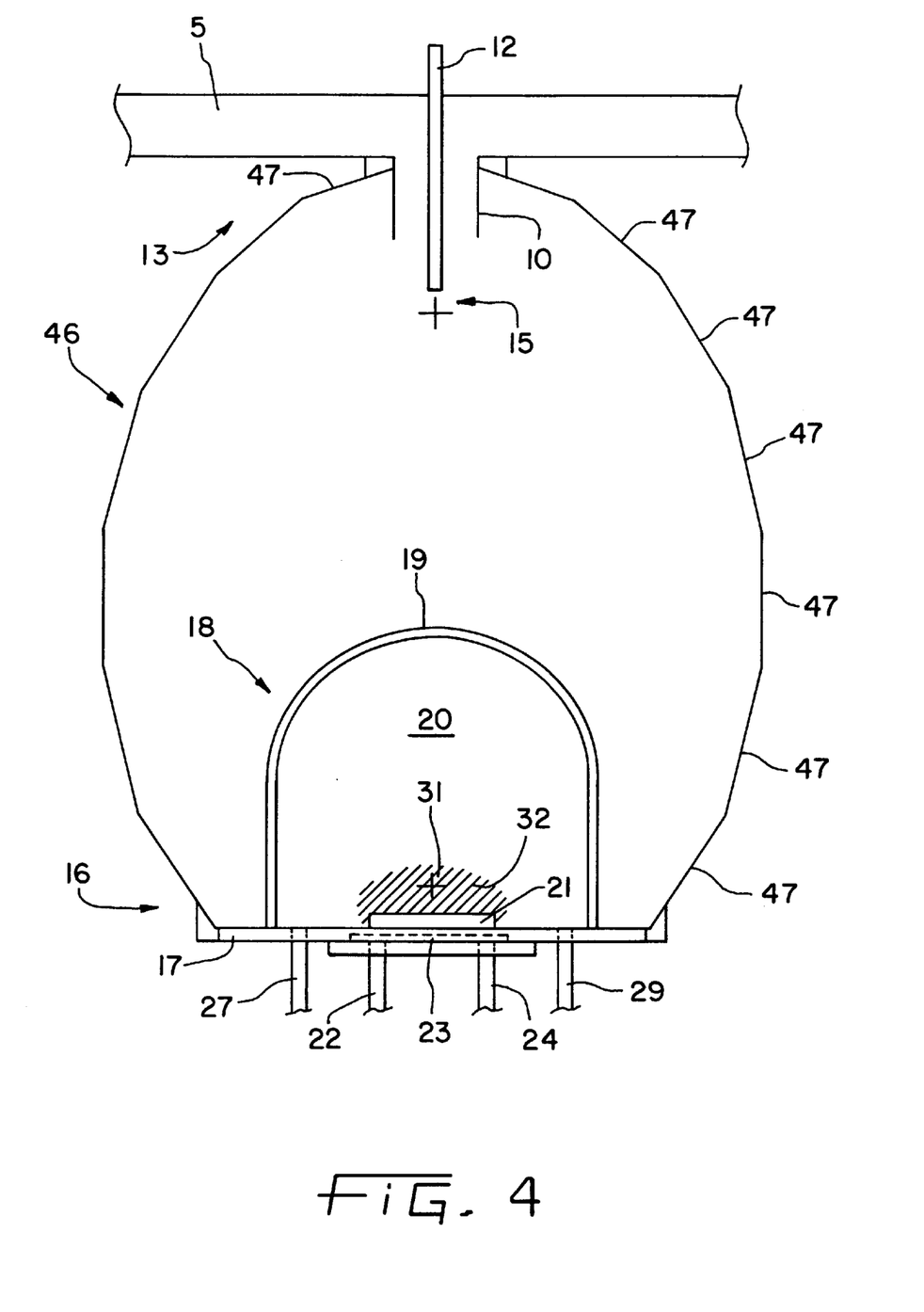
FIG. 4, a partial view of a plasma reactor with an ellipsoidal resonant cavity constructed of annular wall segments.

FIG. 4 shows in a partially sectioned elevation a part of a plasma reactor according to FIG. 1 featuring a resonant cavity fashioned as an ellipsoidal segment resonator 46, constructed of annular wall segments 47 arranged concentrically about the longitudinal axis. The wall segments 47 are conic shell sections tapering in the direction of the summit regions 13, 16 and joined to one another, enclosing an approximately ellipsoidal cavity. Specifically with low frequencies, the segmental resonator 46 is in comparison with single-piece resonant cavities relatively simple to manufacture, since it can be assembled of wall segments 47 that are easy to produce. The increase of the main peaks 15, 31 over the secondary peaks is influenced only insignificantly by the segmentation.

Figure 5:
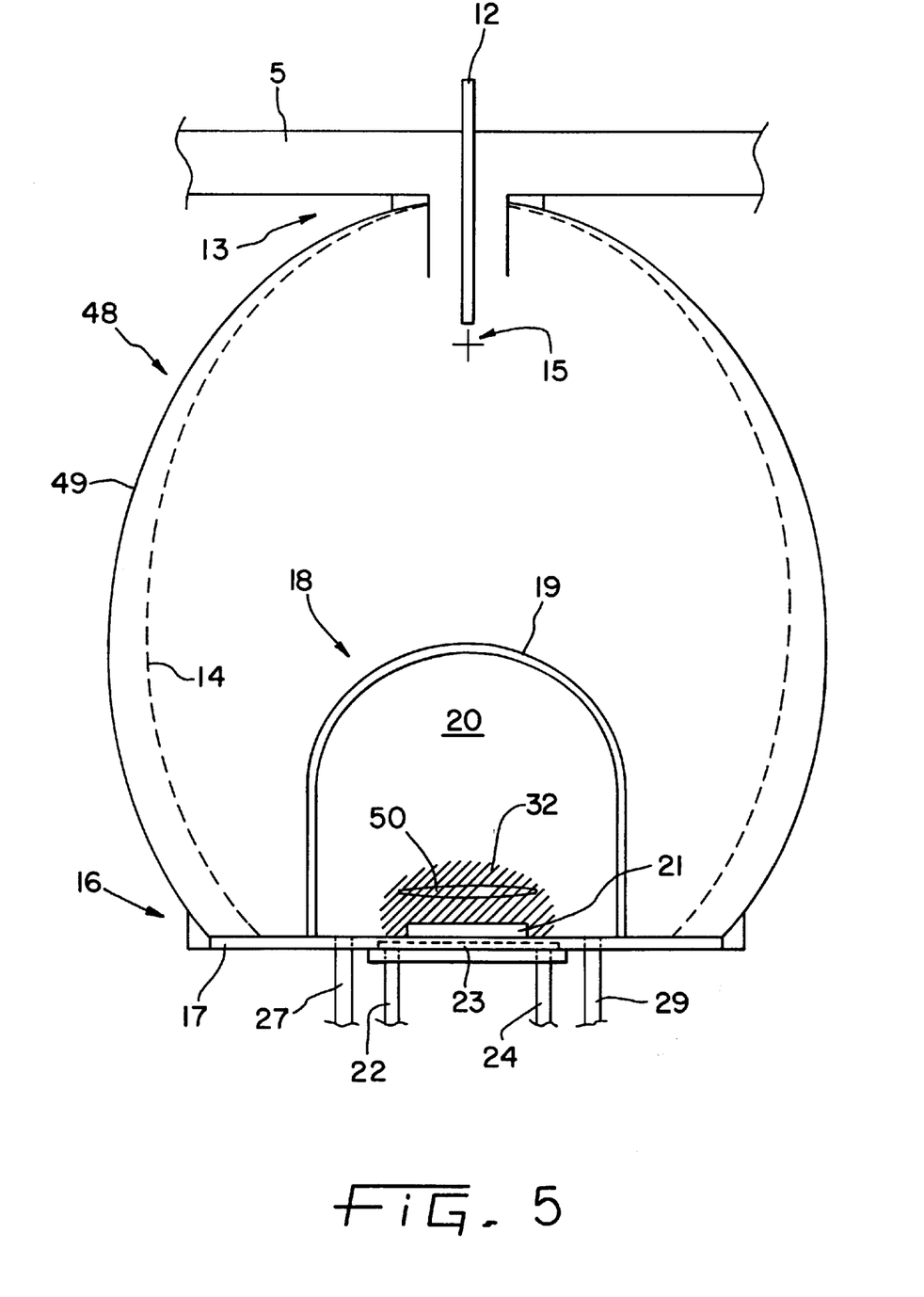
FIG. 5, a partial view of a plasma reactor with an asymmetric ellipsoidal resonant cavity.

FIG. 5 shows in a partial section a part of a plasma reactor according to FIG. 1 with an asymmetric bell type resonator 48 whose wall 49 is expanded in the summit region 16 tapering in the direction of the capping plate 17, as compared to the wall 14 of a symmetric ellipsoid resonator illustrated by dashed lines in FIG. 5. Resulting thereof is a widened main peak 50 in the reaction volume 20, whose elevation relative to the secondary peaks is lower though, but a very homogeneous distribution of the field strength in the widened main peak 50 across the surface of the substrate 21 leads to uniform conditions of deposition from the plasma 32.

Figure 6:
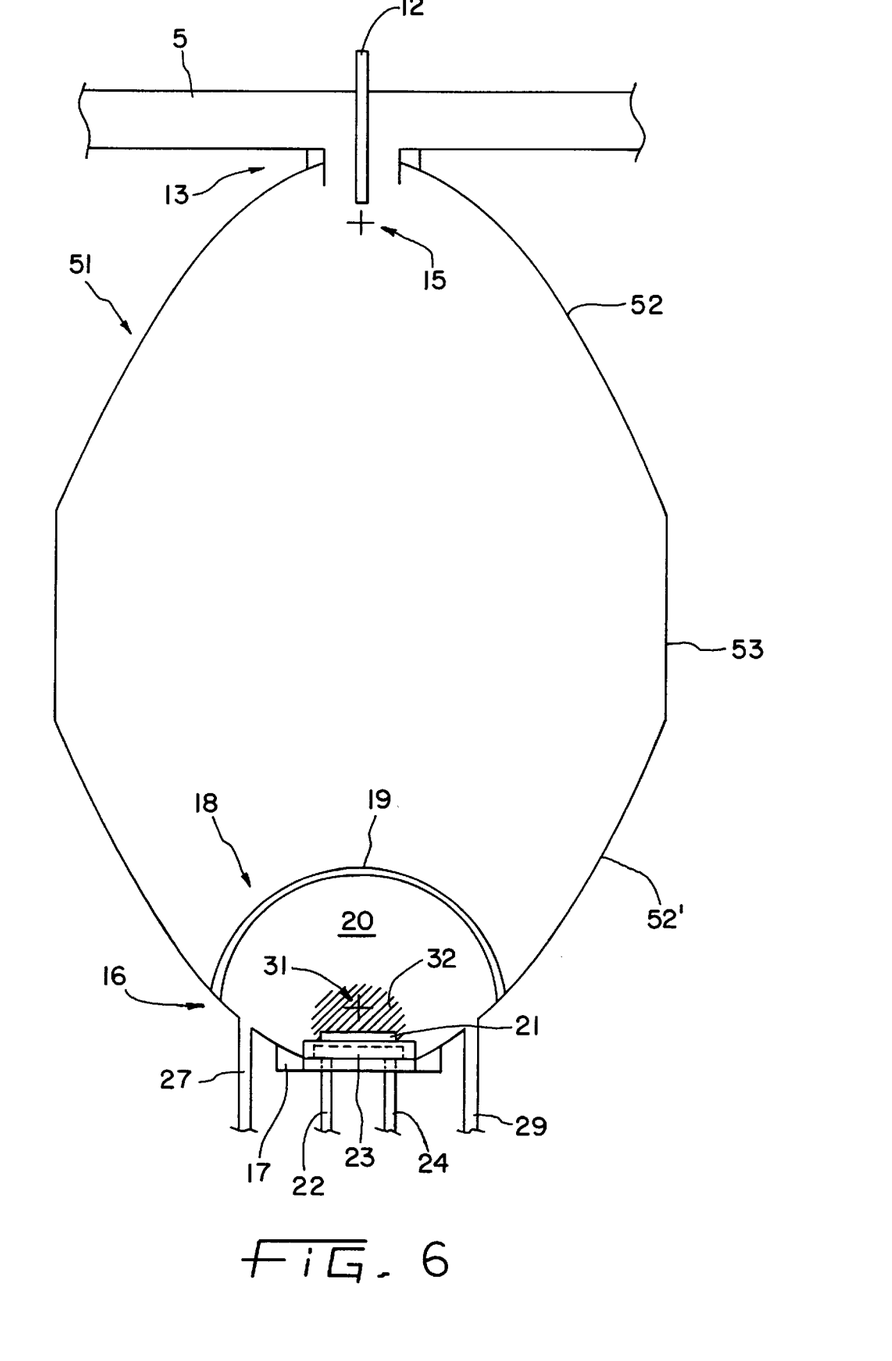

FIG. 6 shows a section of a plasma reactor according to FIG. 1 in a partially sectioned elevation, with a paraboloid resonator 51 whose summit regions 13, 16 are formed by paraboloid sections 52, 52'. The paraboloid sections 52, 52' are joined to one another via a cylindrical section 53. A resonant cavity pursuant to the paraboloid resonator 51 achieves a great spatial concentration of the field strength in the region of the main peaks 15, 31.

Figure 7:
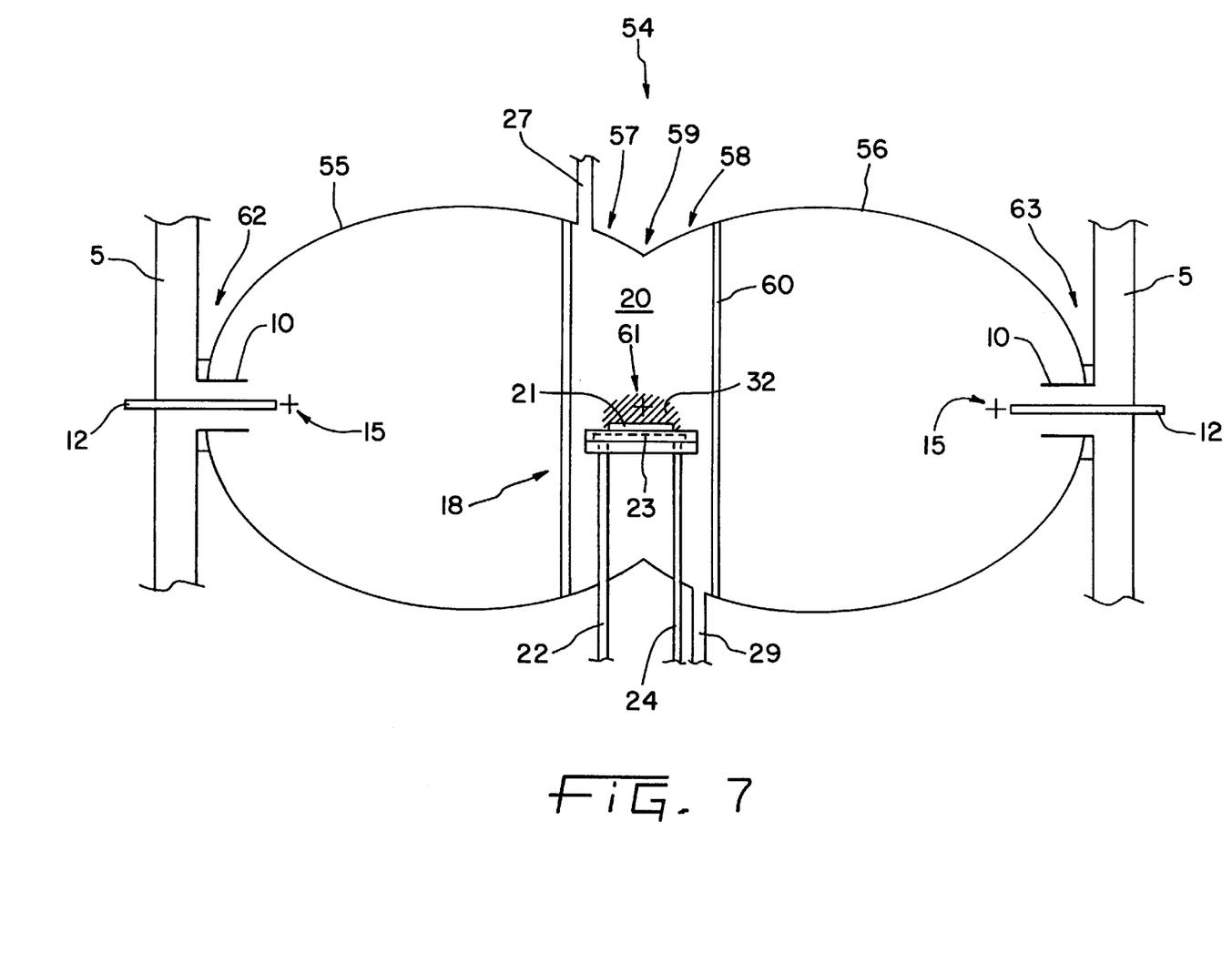
FIG. 7, a partial view of a plasma reactor with a resonant cavity formed of two ellipsoid sections joined to one another.

FIG. 7 shows in a partially sectioned elevation a plasma reactor according to FIG. 1 with a double ellipsoid resonator 54 formed of two joined walls 55, 56 of ellipsoid sections. The joined tapering summit regions 57, 58 of the walls 55, 56 form a constriction 59 which symmetrically bounds endwise the reaction volume 20 enclosed by a quartz pipe 60. Disposed in the cross-sectional plane of the constriction 59 is a central peak 61 formed of two superimposed main peaks of the tapering summit regions 57, 58 of the ellipsoid sections, in the vicinity of which central peak the plasma 32 ignites, allowing the coating of the substrate 21.

The electromagnetic power is coupled in the double ellipsoid resonator 54 in the summit regions 62, 63 of the walls 55, 56 of the ellipsoid sections, away from the reaction volume 20. The coupling is effected in keeping with the embodiments taught above, via a coupling 12 each traversing a coupling waveguide 5 and arranged centrically on the longitudinal axis of the double ellipsoid resonator 54 in couplers 10 and terminating in the region of a couplingside main peak 15 of the double ellipsoid resonator 54. The double ellipsoid resonator 54 illustrated in FIG. 7 is characterized by a particularly high electric field strength in the region of the central peak 61.

We claim:

1. Plasma reactor for generating and maintaining a plasma, said plasma reactor comprising:

a frequency generator, a resonant cavity supplied by the frequency generator with electromagnetic waves, said resonant cavity defining a plurality of summit regions, a reactor disposed in a region of high field strength in the resonant cavity, the resonant cavity including a wall which defines a resonant cavity of tapering cross section in said summit regions such that a field strength distribution of said resonant cavity includes at least two main peaks and a plurality of secondary peaks a maximum field strength of the main peaks being higher than a maximum field strengths of adjacent secondary peaks.

2. Plasma reactor according to claim 1, wherein the resonant cavity is an ellipsoid.

3. Plasma reactor according to claim 2, wherein the ellipsoid is rotationally symmetric with respect to a longitudinal axis of said ellipsoid.

4. Plasma reactor according to claim 1, wherein said summit regions are summit sections of a paraboloid.

5. Plasma reactor according to claim 4, wherein the summit sections are rotationally symmetric with respect to a longitudinal axis of the paraboloid.

6. Plasma reactor according to claim 1 wherein a cylindrical section is disposed between the tapering regions.

7. Plasma reactor according to claim 1 wherein the wall is comprised of conically tapering annular wall segments.

8. Plasma reactor according to claim 1 wherein the resonant cavity includes at least one constriction with a central peak of the field strength distribution situated between said two main peaks.

9. Plasma reactor according to claim 8, wherein said constriction is defined by ellipsoid sections.

10. Plasma reactor according to claim 1 including a pin type coupling connected to said frequency generator and having a coupling pin that protrudes into the resonant cavity.

11. Plasma reactor according to claim 10, wherein the coupling pin is disposed on a longitudinal axis of the resonant cavity, an end of the coupling pin protruding into the resonant cavity in the region of elevated field strength of a main peak.

12. Plasma reactor according to claim 1 wherein the reactor includes a substrate disposed in a region of a main peak.

13. Plasma reactor according to claim 12 wherein said reactor includes an electrically nonconducting enclosure which defines a reaction volume, said reaction volume sealed from an atmosphere, said substrate and main peak disposed in said reaction volume.

14. Plasma reactor according to claim 13, including means for introducing gases into said reaction volume, said gases ignitable to a plasma in the region of a main peak contained in the reaction volume.

* * * * *